United States Patent
Aimone

(10) Patent No.: US 9,255,309 B2
(45) Date of Patent: *Feb. 9, 2016

(54) FINE GRAIN NIOBIUM SHEET VIA INGOT METALLURGY

(75) Inventor: Paul R. Aimone, Bridgewater, MA (US)

(73) Assignee: H.C. Starck, Inc., Newton, MA (US)

( * ) Notice: Subject to any disclaimer, the term of this patent is extended or adjusted under 35 U.S.C. 154(b) by 258 days.

This patent is subject to a terminal disclaimer.

(21) Appl. No.: 13/463,024

(22) Filed: May 3, 2012

(65) Prior Publication Data

US 2012/0241054 A1     Sep. 27, 2012

Related U.S. Application Data

(63) Continuation of application No. 11/216,498, filed on Aug. 31, 2005, now abandoned.

(51) Int. Cl.
| | |
|---|---|
| *C22B 34/24* | (2006.01) |
| *C22B 9/20* | (2006.01) |
| *C22C 27/02* | (2006.01) |
| *C22F 1/18* | (2006.01) |
| *C23C 14/34* | (2006.01) |
| *H05H 7/20* | (2006.01) |
| *B22F 1/00* | (2006.01) |
| *B22F 3/02* | (2006.01) |
| *B22F 3/14* | (2006.01) |
| *B22F 3/24* | (2006.01) |

(52) U.S. Cl.
CPC . *C22B 34/24* (2013.01); *C22B 9/20* (2013.01); *C22C 27/02* (2013.01); *C22F 1/18* (2013.01); *C23C 14/3414* (2013.01); *H05H 7/20* (2013.01); *B22F 2998/10* (2013.01)

(58) Field of Classification Search
USPC .......................................... 148/538, 557, 668
See application file for complete search history.

(56) References Cited

U.S. PATENT DOCUMENTS

| | | | |
|---|---|---|---|
| 3,269,825 A | 8/1966 | Vordahl | |
| 3,269,826 A | 8/1966 | Bumgarner | |
| 3,565,602 A | 2/1971 | Konisi et al. | |
| 3,933,474 A * | 1/1976 | Ham et al. | 75/10.26 |
| 5,171,379 A | 12/1992 | Kumar et al. | |
| 5,498,186 A | 3/1996 | Benz et al. | |
| 5,580,516 A | 12/1996 | Kumar | |
| 5,699,401 A | 12/1997 | Jackson et al. | |
| 5,846,287 A | 12/1998 | Kumar et al. | |
| 6,004,368 A | 12/1999 | Chandley et al. | |
| 6,334,912 B1 | 1/2002 | Ganin et al. | |
| 6,348,113 B1 | 2/2002 | Michaluk et al. | |
| 6,540,851 B2 | 4/2003 | Huber, Jr. et al. | |
| 6,575,069 B1 | 6/2003 | Harwarth et al. | |
| 2002/0026965 A1 | 3/2002 | Michaluk et al. | |
| 2002/0072475 A1 | 6/2002 | Michaluk et al. | |
| 2002/0112789 A1 | 8/2002 | Jepson et al. | |
| 2003/0019106 A1 | 1/2003 | Pope et al. | |
| 2006/0086438 A1 | 4/2006 | Aimone et al. | |

FOREIGN PATENT DOCUMENTS

| | | |
|---|---|---|
| EP | 1652945 | 5/2006 |
| JP | 2005064038 A * | 3/2005 |
| WO | WO-92/20828 | 11/1992 |
| WO | WO-01/96620 | 12/2001 |
| WO | WO-02/88412 | 11/2002 |
| WO | WO-2005/098073 | 10/2005 |

OTHER PUBLICATIONS

Masubuchi et al., English machine translation of JP 2005-064038, Mar. 2005, p. 1-8.*

Shields et al., "Heat Treating of Refractory Metals and Alloys", ASM Handbook, 1991, ASM International, vol. 4, p. 1-4.*

International Search Report and Written Opinion mailed Feb. 14, 2007 for International Application No. PCT/US2006/032578 (9 pages).

* cited by examiner

*Primary Examiner* — Roy King
*Assistant Examiner* — Caitlin Kiechle
(74) *Attorney, Agent, or Firm* — Morgan, Lewis & Bockius LLP

(57) ABSTRACT

In various embodiments, metallic products are formed by alloying niobium with at least one of yttrium, aluminum, hafnium, titanium, zirconium, thorium, lanthanum, or cerium and processing the alloy.

15 Claims, No Drawings

FINE GRAIN NIOBIUM SHEET VIA INGOT METALLURGY

CROSS-REFERENCE TO RELATED APPLICATION

This application is a continuation of U.S. patent application Ser. No. 11/216,498, filed on Aug. 31, 2005, now abandoned, the entire contents of which are incorporated by reference herein.

BACKGROUND OF THE INVENTION

The present invention relates to a process for manufacturing niobium plates or sheets as well as uses thereof, such as for deep drawn cups and sputtering targets.

Niobium ingots can be rolled to plate and sheet dimensions using known methods in the art. Such plates and sheets can be used, for example, by being deep drawn into cups for the synthetic diamond industry. The niobium foil used typically has an inconsistent and coarse grain size, which leads to poor flatness and smoothness of the deep drawn cup bottom. Poor flatness and/or smoothness (orange peel) result in a synthetic diamond that requires excessive grinding to correct deficiencies. The problem ultimately relates to a coarse grain structure in the niobium sheet. The coarse grain structure can also cause tearing of the sheet during deep-draw operations.

The grain size of typical, commercially available niobium sheet is variable, ranging from an ASTM grain size of from 4 to 10. It is, however, desirable to use niobium sheet with an ASTM grain size finer than 7.5 with at least 90% recrystallization for deep draw applications, although this still produces a high rejection rate for flatness and surface finish. An ASTM grain size finer than 8.0 with at least 90% recrystallization almost completely eliminates these issues.

It would be desirable to provide a method of producing niobium sheet having a consistent ASTM grain size and sufficient recrystallization to minimize or prevent flatness and/or smoothness problems with the sheet.

U.S. application Ser. No. 10/974,519, filed Oct. 27, 2004 describes a silicon-containing alloy of niobium that solves the above-identified problem.

DESCRIPTION OF THE INVENTION

The present invention is directed to a method of making an alloy of niobium. The method includes:
A) forming a blend comprising niobium powder and a powder of a metal selected from the group consisting of yttrium, aluminum, hafnium, titanium, zirconium, thorium, lanthanum and cerium and pressing the blend to form pressed blend;
B) attaching the pressed blend to an electrode comprising niobium;
C) melting the electrode and pressed blend under vacuum arc remelting conditions, such that the blend mixes with the melted electrode;
D) cooling the melted electrode to form an alloy ingot; and
E) applying thermo-mechanical processing steps to the alloy ingot to form a wrought product.

The present invention is also directed to a niobium containing wrought product prepared according to the above-described method.

The present invention is additionally directed to deep drawn cups and sputtering targets made from the modified niobium wrought product described above.

Other than in the operating examples, or where otherwise indicated, all numbers or expressions referring to quantities of ingredients, reaction conditions, etc. used in the specification and claims are to be understood as modified in all instances by the term "about."

The present invention relates to a method for manufacturing niobium wrought products. The method provides a significant reduction as well as better control of the final grain size in niobium wrought products. More particularly, the present invention provides niobium wrought products that contain greater than 5 ppm of the alloying metal, which has a consistently fine, uniform, and fully recrystallized grain structure.

As used herein, the term "wrought products" refers generally to metals that have been exposed to thermo-mechanical processing steps to acquire a specific shape and/or other properties. The thermal steps can include, but are not limited to annealing, baking, smelting and/or melting. The mechanical steps can include, but are not limited to working, forging, rolling, upset forging, upset-and-forge-back techniques, hammer forging, drawback forging, flat forging, round forging, and radial forging.

Wrought products, as provided in the present invention include, but are not limited to generally planar metal forms such as foils (less than about 10 mil in thickness), sheets (from about 10 to about 125 mil in thickness), and plates (greater than about 125 mil in thickness. Other wrought product forms can include tubes, where a length of metal is hollow in the center (and can have any cross-sectional internal and external shape, but often those shapes will be circular, oval, square, rectangular, triangular, hexagonal, or octagonal); and rods, which are lengths of metal that are solid throughout and can have any cross-sectional internal and external shape, but often those shapes will be circular, oval, square, rectangular, triangular, hexagonal, or octagonal.

In the invention, vacuum arc remelting is used to alloy niobium with low level metal additions along with traditional thermo-mechanical processing with higher annealing temperatures to produce niobium wrought products with a fine and fully recrystallized grain structure. The inventive process provides high yields, a more consistent product, and lower manufacturing costs.

In an embodiment of the present invention, the metal selected from the group consisting of yttrium, aluminum, hafnium, titanium, zirconium, thorium, lanthanum and cerium is present at a level of at least 0.01 ppm, in some cases 0.1 ppm and as high as 60 ppm, in some cases 50 ppm based on the total niobium in the niobium ingot. The amount of metal in the niobium can be any value or can range between any of the values recited above.

In the present method, a blend containing niobium powder and a metal powder selected from the group consisting of yttrium, aluminum, hafnium, titanium, zirconium, thorium, lanthanum and cerium is formed and pressed to form a pressed blend. As used herein, the term "pressed blend" refers to a solid form where a mixture of materials are compressed to form a stable shape, which is capable of being attached to another body, such that when the other body melts, the pressed blend melts and commingles with the elements of the other body.

The pressed blends are attached to electrodes that contain niobium using a suitable method and both are melted under vacuum arc remelting (VAR) conditions and subsequently cooled. In other words, the niobium acts as an electrode, and is melted by striking an arc between a charged electrode and the niobium, under vacuum. The arc power can be from 25 to 50V and from 7,000 to 10,000 amps.

Typically, a pressed blend of niobium and the metal selected from the group consisting of yttrium, aluminum, hafnium, titanium, zirconium, thorium, lanthanum and cerium is used with a niobium electrode.

The melted electrode and pressed blend is cooled to form an alloy ingot.

Thermo-mechanical processing steps as indicated above are applied to the alloy ingot to form a wrought product as described above.

After forging, the alloy ingot can be vacuum annealed at a temperature of at least 950° C. and up to 1150° C. The annealing temperature for the wrought product can be any value or range between the values recited above.

The annealing step can take at least 5 minutes and up to 180 minutes. The length of time for annealing can be any value or can range between any values recited above.

The annealing step can result in at least 75% recrystallization and in some cases up to at least 95% recrystallization.

In an embodiment of the invention, sequential rolling and annealing steps can be carried out on the alloy ingot. Any suitable combination of rolling and annealing steps can be used. In a particular embodiment of the invention, the following steps are used:
I) rolling the wrought product to an intermediate thickness;
II) annealing the wrought product of I) at a temperature of from 950 to 1150° C. for a period of from 30 minutes to 180 minutes;
III) rolling the wrought product of II); and
IV) annealing the wrought product of III) at a temperature of from 950 to 1150° C. for a period of from 30 minutes to 180 minutes and then cooling the wrought product to room temperature.

In an embodiment of the invention, the intermediate thickness I) can be from 0.5 to 2 cm and the wrought product III) can have a thickness of from 0.005 to 0.24 cm.

A particular embodiment of the invention provides a method of making an alloy of niobium by
a) melting niobium to form a melt;
b) adding 0.1 to 60 ppm of a metal selected from the group consisting of yttrium, aluminum, hafnium, titanium, zirconium, thorium, lanthanum and cerium, based on the niobium in the melt;
c) cooling the melt to form an alloy ingot;
d) applying thermo-mechanical processing steps to the alloy ingot to form a wrought product.

The thermo-mechanical processing steps in d) can include i) forging the alloy ingot to form a wrought product; and ii) annealing the wrought product at a temperature of from 950 to 1150° C.

Particular sequential rolling and annealing steps can be used in this particular embodiment as described above. The annealing steps can result in at least 75% recrystallization and in some cases up to at least 95% recrystallization.

In an alternative embodiment, scrap niobium is consolidated via VAR, ISM, or other cold hearth melting techniques and the metal (selected from the group consisting of yttrium, aluminum, hafnium, titanium, zirconium, thorium, lanthanum and cerium) addition made directly to the melt or via the VAR process described above.

In the present invention, the cooled, annealed plate and sheet has a fine and uniform ASTM grain size up to 10, and can be as coarse as 5. In an embodiment of the invention, the ASTM grain size is in the range of 8 to 10.

The present invention also provides for wrought product made according to the above described processes, where the wrought products are selected from a foil, a sheet, a plate, a tube, and a rod.

The present invention also provides for deep drawn cups or sputtering targets obtained using, made from, or including the above-described wrought products.

Not wishing to be bound to a single theory, it is believed that the metal (selected from the group consisting of yttrium, aluminum, hafnium, titanium, zirconium, thorium, lanthanum and cerium) combines with niobium to form alloy particles in the niobium or possibly with oxygen to produce sub-micron size oxides of the respective metal added. Rolling (cold working) to sheet produces a uniform dispersion of these particles that on subsequent annealing act initially as grain nucleation sites and, with continued annealing, as grain boundary pinning points.

Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

What is claimed is:

1. A method for forming a metallic product, the method comprising:
melting niobium to form a melt;
adding an amount greater than 5 ppm and no greater than 100 ppm, based on the niobium in the melt, of a metal consisting of at least one of yttrium, aluminum, hafnium, titanium, zirconium, thorium, lanthanum, or cerium to form a melted blend consisting of only the niobium and the metal in an amount greater than 5 ppm and no greater than 100 ppm;
cooling the melted blend to form an alloy ingot; and
thermo-mechanically processing the alloy ingot to form a wrought product having a uniform ASTM grain size of 5 to 10.

2. The method of claim 1, wherein thermo-mechanically processing the alloy ingot comprises (i) forging the alloy ingot to form the wrought product and (ii) annealing the wrought product.

3. The method of claim 2, wherein the wrought product is annealed at a temperature selected from the range of 950° C. to 1150° C.

4. The method of claim 2, wherein the wrought product is at least 75% recrystallized after annealing.

5. The method of claim 1, wherein the wrought product is a foil, a sheet, a plate, a tube, or a rod.

6. The method of claim 1, wherein thermo-mechanically processing the alloy ingot comprises (i) rolling the alloy ingot and (ii) annealing the rolled alloy ingot.

7. The method of claim 6, wherein the rolled alloy ingot is annealed at a temperature selected from the range of 950° C. to 1150° C.

8. The method of claim 1, wherein the metal consists of at least one of aluminum, hafnium, titanium, or zirconium.

9. The method of claim 8, wherein the metal consists of aluminum.

10. The method of claim 8, wherein the metal consists of hafnium.

11. The method of claim 8, wherein the metal consists of titanium.

12. The method of claim 8, wherein the metal consists of zirconium.

13. The method of claim 1, wherein adding the metal to the niobium to form the melted blend comprises melting the metal with the niobium.

14. The method of claim 1, wherein the melted blend consists of only the niobium and the metal in an amount greater than 5 ppm and no greater than 60 ppm.

15. The method of claim 1, wherein the melted blend consists of only the niobium and the metal in an amount greater than 5 ppm and no greater than 50 ppm.

\* \* \* \* \*